United States Patent
Gorokhovsky et al.

(10) Patent No.: US 6,617,057 B2
(45) Date of Patent: Sep. 9, 2003

(54) COMPOSITE VAPOR DEPOSITED COATINGS AND PROCESS THEREFOR

(76) Inventors: Vladimir Gorokhovsky, 255 Shaftsbury Avenue, Unit 34, Toronto, Ontario (CA), M6K 1W8; Nicholas Bekesch, 835 Forest Glen Avenue, Burlington, Ontario (CA), L7T 2L1

( * ) Notice: Subject to any disclaimer, the term of this patent is extended or adjusted under 35 U.S.C. 154(b) by 0 days.

(21) Appl. No.: 09/725,203

(22) Filed: Nov. 29, 2000

(65) Prior Publication Data
US 2002/0102400 A1 Aug. 1, 2002

Related U.S. Application Data
(60) Provisional application No. 60/167,699, filed on Nov. 29, 1999.

(51) Int. Cl.[7] .................................................. B32B 9/00
(52) U.S. Cl. ........................ 428/698; 428/156; 428/174; 428/216; 428/336; 428/469; 428/472
(58) Field of Search ................................. 428/469, 472, 428/658, 216, 336, 174, 156

(56) References Cited

U.S. PATENT DOCUMENTS 4,643,951 A * 2/1987 Keem et al.
5,126,030 A * 6/1992 Tamagaki et al.
5,223,337 A * 6/1993 van den Berg et al.
5,266,389 A * 11/1993 Omori et al.
5,759,677 A * 6/1998 Fink

FOREIGN PATENT DOCUMENTS

| EP | 0 289 173 | * 11/1988 |
| GB | 2 170 226 | * 7/1986 |

* cited by examiner

Primary Examiner—Archene Turner
(74) Attorney, Agent, or Firm—Gowling Lafleur Henderson LLP

(57) ABSTRACT

A vapour deposited coating on the surface of a metal, such as a stainless steel substrate, obtained in a plasma vapour depositing device having magnetic vapour stream filtering means. The vapour deposited coating comprises pairs of a metal layer and a ceramic metal compound ("ceramic") layer. The metal layer deposited is one of titanium, chromium, vanadium, aluminum, molybdenum, niobium, tungsten, zirconium, hafnium or alloys ofthese metals. The ceramic layer is a nitride, carbonitride, carbide, oxycarbide or oxynitride of one or an alloy of the above metals. The substrate surface is optionally ion nitride prior to the vapour deposition of the metal—ceramic layers. The substrate bearing pairs of metal—ceramic layers may be subsequently heat treated. The obtained coating on a metal substrate exhibits high wear resistance and hardness and low surface roughness.

8 Claims, 3 Drawing Sheets

COMPOSITE VAPOR DEPOSITED COATINGS AND PROCESS THEREFOR

This application claims the benefit of U.S. Provisional Application No.: 60/167,699, filed Nov. 29, 1999.

FIELD OF INVENTION

This invention is related to hard, wear resistant coatings vapour deposited over a metallic or non-metallic surface, in particular to tools utilized in industrial, medical and dental cutting, and form scraping.

BACKGROUND OF THE INVENTION

Hard wearing surfaces are in common use in various industries, and such hard wearing surfaces are frequently obtained by coating the surface of a tool made of steel or similar metal, or other hard, enduring material, with a layer of hard wearing ceramic substance, such as carbides, nitrides and carbonitrides, or providing a hard microcrystalline diamond coating. There are known methods for obtaining hard wearing coatings, such as for example, having a coating of diamond particles in combination with a carbide or nitride layer and then filling the gaps between the abrasive particles with a softer intermetallic compound. Another known method is vapour deposition of hard-wearing ceramic materials from plasma or by utilising molten ceramic substances. Hard wearing surfaces for use on medical, surgical and dental tools have additional requirements, as such surgical and dental tools need to be frequently sterilised, hence medical tools have to be corrosion resistant. A device for yielding hard ceramic surfaces by cathodic arc plasma deposition is described in U.S. Pat. No. 4,851,095, issued to M. A. Scobey et al. on Jul. 25, 1989. The apparatus of Scobey et al. utilises a high intensity ion flux. Vapour deposition of a hard ceramic material, such as titanium or zirconium nitride on a stainless steel or titanium surface by utilizing a molten evaporant and a hollow cathode, is described in U.S. Pat. No. 5,152,774, issued to W. A. Schroeder on Oct. 6, 1992. The vapour deposition of Schroeder is conducted at relatively low temperature, thus the substrate will have lost little of its initial high strength properties, however, the requirement of low surface roughness of the deposited layer is not addressed by U.S. Pat. No. 5,152,774. In U.S. Pat. No. 4,981,756, issued to H. S. Rhandhawa on Jan. 1, 1991, a method is taught to coat surgical tools and instruments by cathodic arc plasma deposition. The ceramic coating obtained by this technology is a nitride, carbide or carbonitride of zirconium or hafnium, in a single layer of 3–10 $\mu$m thickness. U.S. Pat. No. 4,981,756 also refers to various publications describing known equipment for obtaining hard-wearing surfaces by cathodic arc plasma deposition. U.S. Pat. Nos. 5,940,975 and 5,992,268 issued to T. G. Decker et al. on Aug. 24, 1999 and Nov. 30, 1999, respectively, teach hard, amorphous diamond coatings obtained in a single layer on thin metallic blades or similar metallic strips utilizing filtered cathodic arc plasma generated by vaporizing graphite. It is noted that no interlayer is formed between the blade surface and the deposited amorphous diamond coating.

It is known to have titanium and titanium nitride coated dental tools and surgical instruments wherein the coating is obtained by conventional cathodic arc deposition applied to corrosion resistant stainless steel substrates. The cutting surfaces of such medical tools need to be smooth, as well as hard-wearing to prevent trapping and retaining materials which can be harmful to the patient. Hence, another requirement is that the cutting edges be very straight, sharp and nick-free to avoid damage to the surrounding flesh and skin during dental treatment. There are known methods described, wherein the cutting tips of surgical instruments made of steel have been sand-blasted and then coated with a hard-wearing ceramic composition, however this method may, or is likely to increase surface roughness and unevenness, rather than eliminate it. The grain size of deposits obtained in conventional cathodic plasma arc methods may range between 0.5 to 10 $\mu$m. Any post-deposition heat treatment which may be required to maintain corrosion resistance of the substrate, may lead to internal stresses in the coating due to differences in the grain size, and can eventually lead to abrasion, spalling, crack formation, grain separation, surface fractures, uneven edges and rough surfaces, and such like, which can drastically reduce the wear resistance and durability of surgical instruments and dental tools. None of the above discussed methods are concerned with even grain size and surface structure, and low micro-roughness of the vapour deposited hard, ceramic coatings, which have particular importance for dental and surgical tools, and in other applications where straight, sharp, even and nick-free edges are essential requirements.

There is a need for a method to obtain fine grained, hard wearing ceramic surfaces having low micro-roughness, sharp even edges, which can also withstand post-deposition heat treatment without detriment and degradation of the coating.

SUMMARY OF THE INVENTION

An object of the invention is to obtain a coating made of alternating metal and metal ceramic layers of relatively even surface structure and grain size over a requisite surface area of a hard substrate. The coating is obtained by first cleaning, then optionally ion nitriding the surface of a steel, titanium, carbide or similar hard substrate, and subsequently vapour depositing in a cathodic arc plasma deposition device alternating metal and ceramic layers utilizing a magnetically filtered cathodic arc plasma. The magnetic filtration regulates the evenness of the grain size of the deposited layer, and thus a hard-wearing surface having low micro-roughness can be obtained.

According to one embodiment of the present invention a wear resistant, composite vapour deposited metal ceramic coating is provided on a substrate capable of electrical conduction. The coating includes at least one metallic layer selected from the group consisting of titanium, chromium, vanadium, aluminum, molybdenum, niobium, tungsten, hafnium, zirconium and alloys thereof and having a metallic layer thickness. The coating further includes at least one ceramic layer selected from the group consisting of nitrides, carbides, carbohydrides, oxycarbides and oxynitrides. The composite, vapour deposited metal-ceramic coating has a thickness greater than not 0.25 $\mu$m, a micro-roughness less than the total thickness of the uppermost ceramic layer, and a micro-hardness in excess of 20 GPa.

The substrate may be of steel. The steel may have an ion nitrided surface layer between it and the composite vapour deposited metal-ceramic coating.

The composite vapour deposited coating may have at least one pair of a metal layer and a ceramic layer having a common metal ion component.

The vapour deposited coating may comprise a multiplicity of pairs of metal and ceramic layers having a common metal ion component.

The composite vapour deposited metal-ceramic coating may be heat treated subsequent to deposition.

The coating thickness may range between 0.25 μm and 20 μm.

The thickness of the metal layer may range between 0.05 μm and 0.5 μm.

The vapour deposited metal-ceramic coating may comprise a portion of a surface of a dental tool, a surgical tool or a cutting tool.

A process is provided for producing a wear resistant, composite vapour deposited metal-ceramic coating on the surface of the substrate capable of electrical conduction, the process comprise of the steps of:

i) providing a substrate capable of electrical conduction, having a surface and cleaning said surface by applying at least one cleaning method selected from the group consisting of chemical cleaning, electrolytic cleaning, grinding, polishing, and ion bombardment to produce a cleaned substrate;

ii) placing said cleaned substrate in the vacuum chamber of a vapour depositing device capable of providing controlled electric and magnetic fields and having a substrate holder capable of holding at least one substrate, a target electrode holder and an inlet for a vapour depositing atmosphere of controlled composition and pressure;

iii) providing a target electrode within said vacuum chamber, of one of the metals selected from the group consisting of titanium, chromium, vanadium, aluminum, molybdenum, niobium, tungsten, hafnium, zirconium, and alloys thereof;

iv) providing a vapour depositing atmosphere within said vacuum chamber, comprising at least one of the gases selected from the group consisting of argon, nitrogen, methane or other hydrocarbon gas and oxygen.

v) optionally treating said surface of said substrate in an ion nitriding process step;

vi) applying electric potential and a filtering magnetic field in an argon atmosphere within said vacuum chamber, to obtain a first, vapour deposited metal layer selected from the group consisting of titanium, chromium, vanadium, aluminum, molybdenum, niobium, tungsten, hafnium, zirconium, and alloys thereof, on said surface of said substrate;

vii) applying electric potential and a filtering magnetic field in an atmosphere within said vacuum chamber, containing at least one of the gases selected from the group consisting of nitrogen, methane, oxygen and water vapour, to obtain a second, vapour deposited layer of a ceramic compound of a metal selected from the group consisting of titanium, chromium, vanadium, aluminum, molybdenum, niobium, tungsten, hafnium, zirconium, and alloys thereof, on said first layer deposited on said surface of said substrate;

viii) repeating steps vi) and vii), thereby obtaining a third, vapour deposited metal layer and a fourth, vapour deposited ceramic compound layer on said surface of said substrate;

ix) removing said substrate having at least four vapour deposited layers on said substrate surface, from said vapour depositing device; and x) heat treating the obtained vapour deposited coating comprising at least four vapour deposited layers on said substrate surface.

Steps vi) and vii) may be repeated to provide a fifth, vapour deposited metal layer and a sixth vapour deposited ceramic compound layer on the surface of the substrate prior to the heat treatment.

Steps vi) and vii) may be repeated to provide a first multiplicity of vapour deposited metal layers and a second multiplicity of vapour deposited ceramic compound layers on the surface of the substrate prior to the heat treatment.

The substrate may be of steal.

Figure 1:
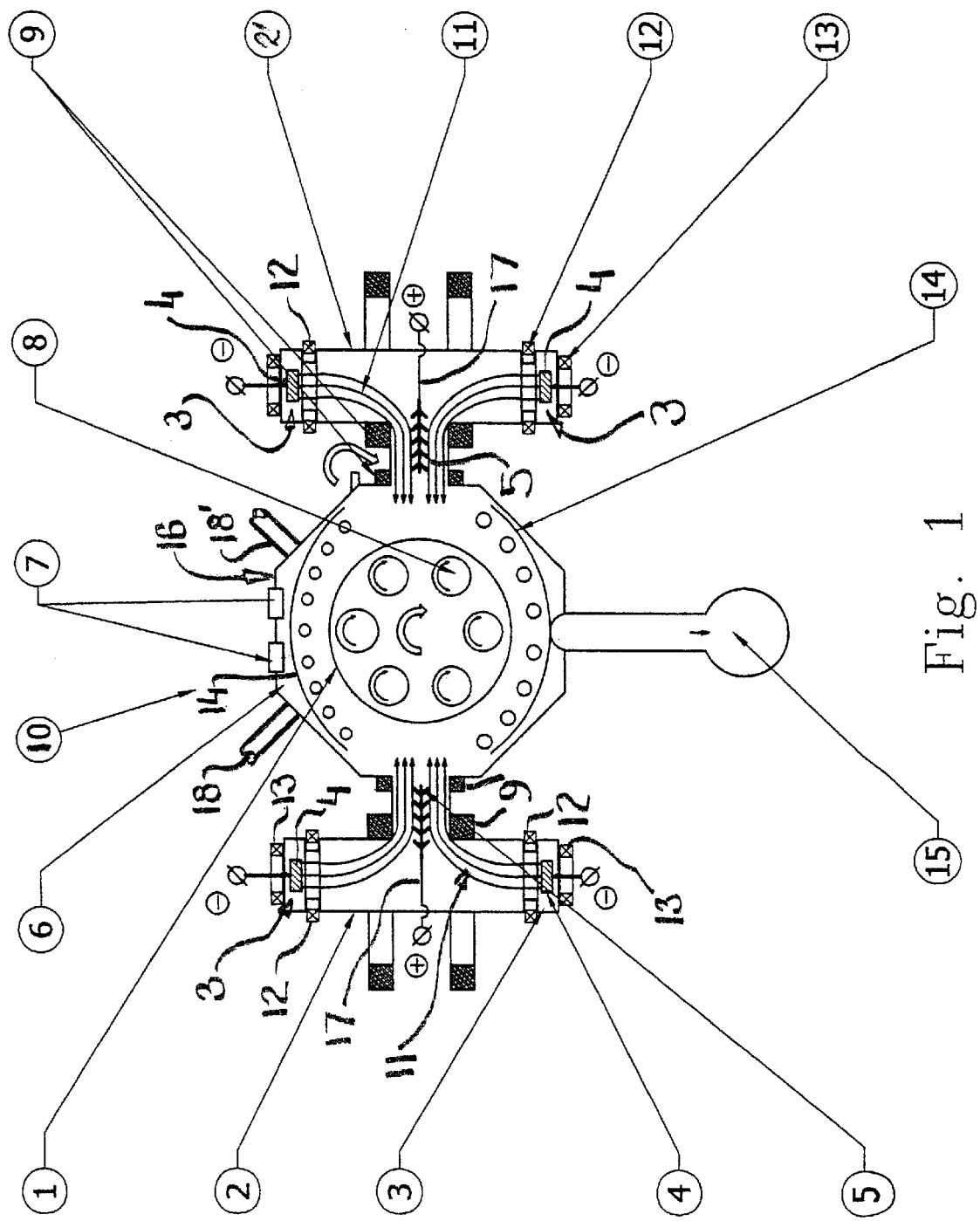
FIG. 1 is a schematic drawing of the cathodic arc plasma depositing device utilized in this invention.

A detailed description of the preferred embodiments of the invention will follow, illustrated by working examples.

DETAILED DESCRIPTION OF THE PREFERRED EMBODIMENTS

As discussed above, providing a vapour deposited coating of hard-wearing particles on a metal or similar hard surface such as, for example, a carbide, nitride or boride surface, is known. One difficulty frequently encountered is that the deposited hard-wearing particles, especially when such have a wide variation in size, may become loose and detached from the surface. To eliminate such problems the hard-wearing particles can be coated with a another hard-wearing material or/and the composite layer can be coated with a softer material to increase adhesion of the different particles to one another and to the substrate surface.

For the sake of clarity, definition of what is understood by some of the terminology used in the discussion of the preferred embodiments of the present invention is provided below.

"Substrate" is understood to mean a three dimensional body providing the surface on which the vapour species is deposited. Only a portion of the surface, usually the surface in the proximity of one end of the substrate body, is utilized as the depositing surface, and the other end of the body of the substrate is attached to or is supported by, a substrate mount or holder. It is preferred that the portion of the surface on which the deposit is to be obtained, has close to uniform temperature, while the rest of the substrate may be in a temperature gradient.

"Plasma" is considered to mean an atmosphere of low pressure and high temperature, containing ionised gaseous species. Not all the gases in the plasma are ionised, but it is usual that the species to be deposited is ionised. The components of a plasma often include argon or similar inert gases, both in the atomic state and in an ionised state.

"Even surface" in the context of a deposited layer surface is understood to mean that the average distance between the peaks of the deposited surface and the valleys of the deposited surface, is small. In other words, the micro-roughness of an evenly deposited surface is considered to be low.

In one embodiment of the present invention multiple layers of a controlled thickness of a metal and of a hard-wearing ceramic compound of the same metal, are deposited in successive steps on a conductive substrate surface, usually a stainless steel surface. It is preferred that at least two pairs of the metal layer and the hard-wearing ceramic layer are deposited on the steel substrate. The number of layer pairs constituting the coating may range from 2 to as high as 6 or even 7, depending on the desired coating thickness, and on economic considerations.

The vapour deposition process of the present invention utilizes plasma technology in conjunction with a cathodic arc source. In the following a brief and simplified description of this technology will be provided, however, it should be understood that this is given merely to allow clarification of the process parameters and is not intended as an accurate scientific description of the mechanisms involved in cathode arc technology. In cathodic arc technology metal droplets and metal vapour are generated by applying an arc of high current to a negatively charged target metal in a vacuum chamber. At the same time, high concentrations of electrons are also released from the target metal cathode at high speed. The vacuum chamber, by definition, contains a gas at a low pressure, and it is usual that the gas is fed to the chamber as a plasma containing a gas or a gas mixture at high temperature in a partially ionised state. The high speed electrons collide with the gas molecules, thereby further ionising the gas molecules, which in turn collide with and ionise the metal droplets and metal vapour. The ionised gas and the ionised metal vapour and metal droplets proceed towards the negatively charged substrate also located in the vacuum chamber. The metal deposits in a layer over the surface of the substrate. When the gas is an inert gas no reaction takes place between the ionised gas and metal vapour. On the other hand, in the instance of the plasma also containing reactive gases, the ionised gases will react with the metal vapour, forming a deposited ceramic compound layer. In conventional cathodic arc plasma deposition the vaporised metal droplets in the plasma can vary in size, thus the metal or the ceramic compound deposited on the substrate is likely to exhibit widely varying grain sizes and surface unevenness.

In a recent modification of plasma technology deposits are obtained by filtering a cathodic arc source by means of appropriately adjusted magnetic fields. An example of such a cathodic arc plasma coating apparatus is described in U.S. Pat. No. 5,435,900 issued to V. I. Gorokhovsky, which is incorporated herein by reference. The large area dual filtered arc depositing apparatus which can be used in practising the present invention is shown schematically in FIG. 1. The arc depositing apparatus 10, contains a main vacuum chamber 6, housing a substrate platform 1, bearing double or triple rotating satellites 8, which are utilized in supporting substrates providing appropriate depositing surfaces. Substrate platform 1 is connected to a negative bias voltage power supply for rendering the substrate surfaces receptive of ions during the deposition process. Two plasma guide chambers 2 and 2' are located on opposing sides of vacuum chamber 6, each enclosing two large area dual filtered cathodic arc sources 3, appended to flanges within the plasma guide chamber. Thus the vacuum chamber 6 contains altogether four cathodic arc sources 3, but only one of those is described in detail. In the preferred arrangement two cathodic arc sources 3 are utilized, located at opposing flanged ends of the plasma guide chamber 2, each having a metal target electrode 4. The metal target 4, is connected to the negative pole of a low voltage high current power supply, thus being capable of generating separate metal vapour jets which converge into metal plasma stream 11. The metal vapour jets are focussed and steered by magnetic coils 12 and 13. Deflecting coils 9 bend and collimate plasma streams 11 to direct the flow towards the substrate depositing surfaces. Metal droplets of larger size, and most of the non-ionised neutral species are trapped on baffles 5, of anode-separators 17. Anode-separators 17, bear a positive potential relative to the plasma stream and thus repel the positively charged ions, urging such ions towards the substrates. Vacuum chamber 6, is equipped with a front door 16, for loading the substrates to be coated. Front door 16, also has view ports and flanges 7, for diagnostic assessment and control of the deposition process. On the perimeter of the vacuum chamber, preferably opposite front door 16, is located vacuum pumping system 15, which is not shown in detail. The vacuum chamber 6, also has gas entry ports 18 and 18'. When the deflecting coils are not activated, the cathodic targets 4, serve as powerful electron emitters, thereby providing high electron currents between the cathodic targets and auxiliary anodes 14. This arrangement creates a highly ionised gaseous environment during all stages of the process: ion cleaning, ion nitriding and deposition of coating layers. In addition, some form of heaters can be connected to the auxiliary anodes 14, to allow the temperature of the depositing surface of the substrate to be controlled independently. It is noted, however, that the apparatus of FIG. 1 is merely an example of a device utilizing magnetic plasma arc filtering. Any other high temperature vapour depositing apparatus which is fitted with magnetic plasma arc filtering means may be employed in practising the present invention. It is also noted, that the preferred vapour depositing device contains an arrangement with four cathodic targets, however, it is possible to operate the device with only two cathodic targets.

The application of magnetic filtering of the cathodic arc stream eliminates droplets of larger sizes, as well as neutral non-ionised species, and thereby substantially only ionised metal vapour and nano-sized metal droplets carrying a charge, will reach the substrate. This results in deposit layers of even grain size, and surfaces having very low microroughness. Such surfaces may be referred to as evenly deposited surfaces.

The substrate selected for deposition in the present process is a conductive material, such as a metal or a hard-wearing substance having relatively high electrical conductivity. In one of the preferred embodiments the substrate is stainless steel of the ASA 400 series.

The substrate surface to be coated is first cleaned, by usual cleaning processes which can include grinding, polishing, chemical cleaning, degreasing, electrolytic cleaning, ion bombardment or similar conventional cleaning steps which can render the surface receptive of the deposited substance.

The cleaned substrate can optionally be ion nitride to increase the hardness and corrosion resistance of the substrate surface and possibly further improve adherence of the deposited coating. The ion nitriding may be conducted in a separate apparatus, or the plasma arc depositing device shown on FIG. 1 can be adapted to the ion nitriding process step.

The substrate having a cleaned, and optionally nitride depositing surface, is then placed in the vacuum chamber of a suitable cathode arc plasma depositing device having magnetic filtering means, such as described above. The target cathode selected for the cathodic arc generation, is a metal which is capable of forming hard, wear resistant compounds by vapour deposition. The metals which are preferred in such compound formation are titanium, chromium, vanadium, molybdenum, aluminum, hafnium, zirconium, niobium, tungsten, their alloys, and metals of similar nature.

The gas atmosphere in the cathodic arc depositing device is controlled such that it can yield either a vapour deposited metal layer or a vapour deposited ceramic compound layer. The ceramic compounds that have desired wear resistance and hardness are the carbides, nitrides, carbonitrides, oxycarbides and oxynitrides of the above listed metals. The plasma for depositing the desired ceramic layers contains one or more of the following gases: nitrogen, methane or other hydrocarbon gas and oxygen. In the vapour deposition of layers of the above listed metals only argon, or similar inert gas containing plasma is used. Argon may also be utilized to dilute or carry the gases reacting with the metal vapour or metal deposit, to form the desired ceramic compounds. The metal and ceramic compound combinations suitable for forming hard, wear resistant coatings by vapour deposition in the present invention, are listed in Table 1 below.

The first metal layer to form a metal-ceramic compound layer pair, is obtained by having one of the metals listed above as cathodic target metal. The metal layer is deposited in an inert gas, usually argon, in a thickness ranging between 0.04 μm and 0.24 μm. The preferred range is 0.05 to 0.1 μm. Usually, the same cathodic target metal is used in obtaining the second, ceramic compound layer of the pair, however, the cathodic plasma arc composition is adjusted to contain the gaseous component required to form the appropriate ceramic compound. The thickness of the vapour deposited ceramic compound layer is usually selected to be between 0.2 and 1.2 μm, depending on the design, shape and ultimate purpose of the deposited coating on the substrate.

Table 1 lists the preferred metals and alloys used for cathodic targets to obtain the metal layer, and the appropriate layer of ceramic compounds in conjunction with the metal layer. It is to be noted, however, that in some instances, it is preferred to use two separate metal targets as cathodes, operated simultaneously, to obtain the deposited metal alloy layer. For example, it may be convenient to use an aluminium target metal cathode and a titanium target metal cathode operated simultaneously, to obtain an Al-Ti alloy layer.

In the preferred embodiment at least two pairs of metal—ceramic compound layers are deposited, but it is often convenient or desirable to have more, that is between 3 to 6, or even 7 pairs of metal—ceramic compound layers. The complete coating can thus contain at least 4, but frequently 6, 8 or alternating metal and—ceramic compound layers. The preferred substrate surface temperature during the cathodic arc plasma deposition steps is between 200 and 500° C. In one of the preferred embodiments the steel substrate having a coating of several vapour deposited layer pairs is subsequently removed from the vacuum chamber of the filtered cathodic arc plasma depositing device, and annealed or heat treated in vacuum or in a low pressure inert gas at a temperature between 900° C. and 1100° C. by usual methods, followed by quenching in nitrogen or nitrogen/argon atmosphere and tempering at 150° C. to 400° C.

TABLE 1

| Item # | Metal Layer | Ceramic metal compound layer in combination with the metal, having desired wear resistant properties |
|---|---|---|
| 1 | Ti | TiC, TiN, Ti(CN), Ti(OCN) |
| 2 | Zr | ZrC, ZrN, Zr(CN), Zr(OCN) |
| 3 | V | VC, VN, V(CN), V(OCN) |
| 4 | Cr | CrN, CrC, CrCN |
| 5 | Hf | HfN |
| 6 | Mo | MoN |
| 7 | Nb | NbN, NbC |
| 8 | W | WC |
| 9 | Ti-Zr alloy | TiZrC, TiZrN, TiZr(CN), TiZr(OCN) |
| 10 | Ti-Cr alloy | TiCrC, TiCrN, TiCr(CN) |
| 11 | V-Ti alloy | VTiC, VTiN, VTi(CN) |
| 12 | Ti | TiMoN |
| 13 | Ti | TiAlN, TiAlON |

TABLE 1-continued

| Item # | Metal Layer | Ceramic metal compound layer in combination with the metal, having desired wear resistant properties |
|---|---|---|
| 14 | Al | AlN, $Al_2O_3$ |
| 15 | Cr | NiCrN |

Figure 2:
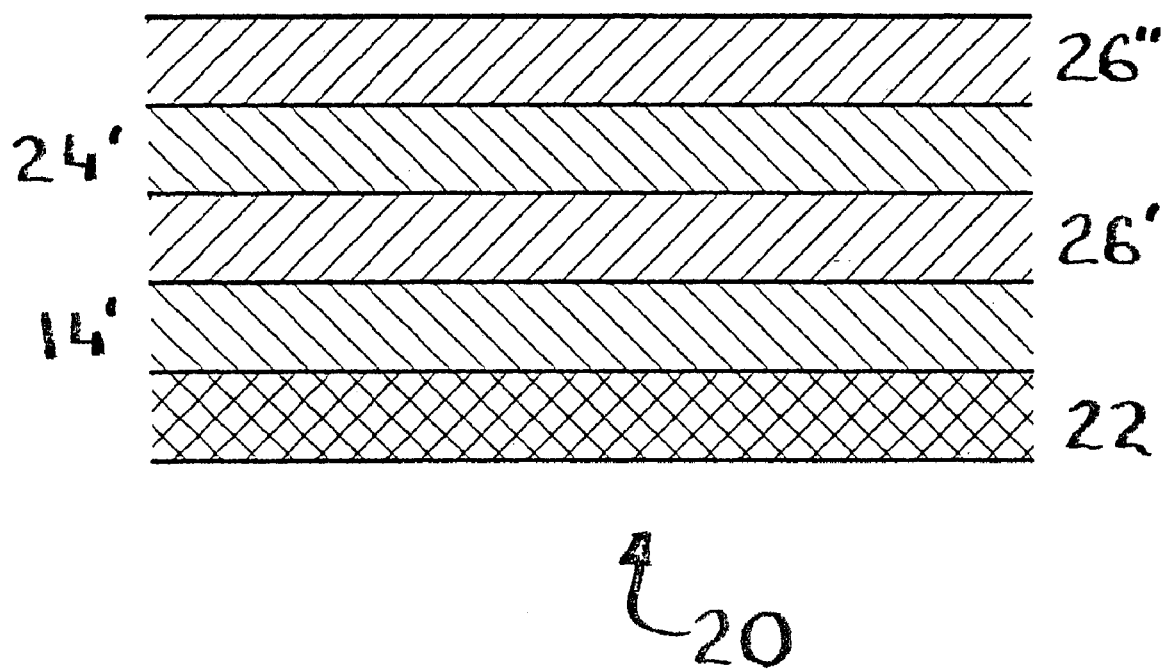
FIG. 2 is a schematic drawing of the cross-section of a multi-layered vapour deposit obtained in accordance with the present invention.

A coating on a portion of a substrate surface obtained by the process of the present invention is shown schematically on FIG. 2 by reference numeral 20. The steel substrate surface which may have been optionally treated by ion nitriding or oxynitriding, is represented as the bottom section 22. The first metal layer, such as titanium, of the first metal—ceramic pair is shown as 24' and the third layer, which is of the same metal in the second pair, is represented as 24". The second layer which is a ceramic layer, such as for example, titanium carbide, in the first pair is represented by reference numeral 26' and the fourth layer which is of the same composition as the ceramic layer of the first pair, is shown as 26".

Figure 3A:
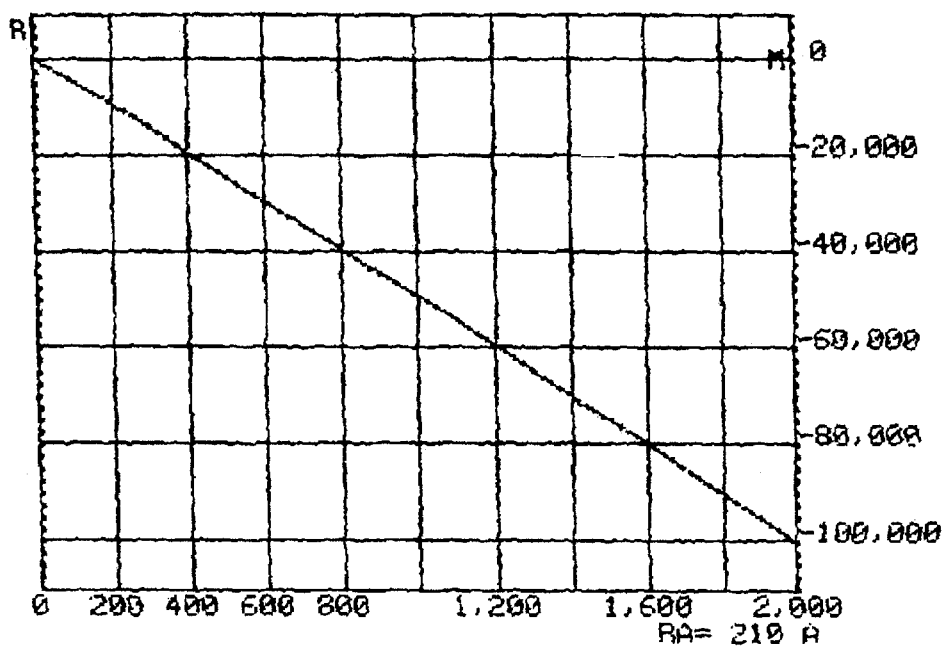
FIGS. 3a and 3b show the surface roughness of a vapour deposit obtained by conventional methods and by the present method, respectively.
Figure 3B:
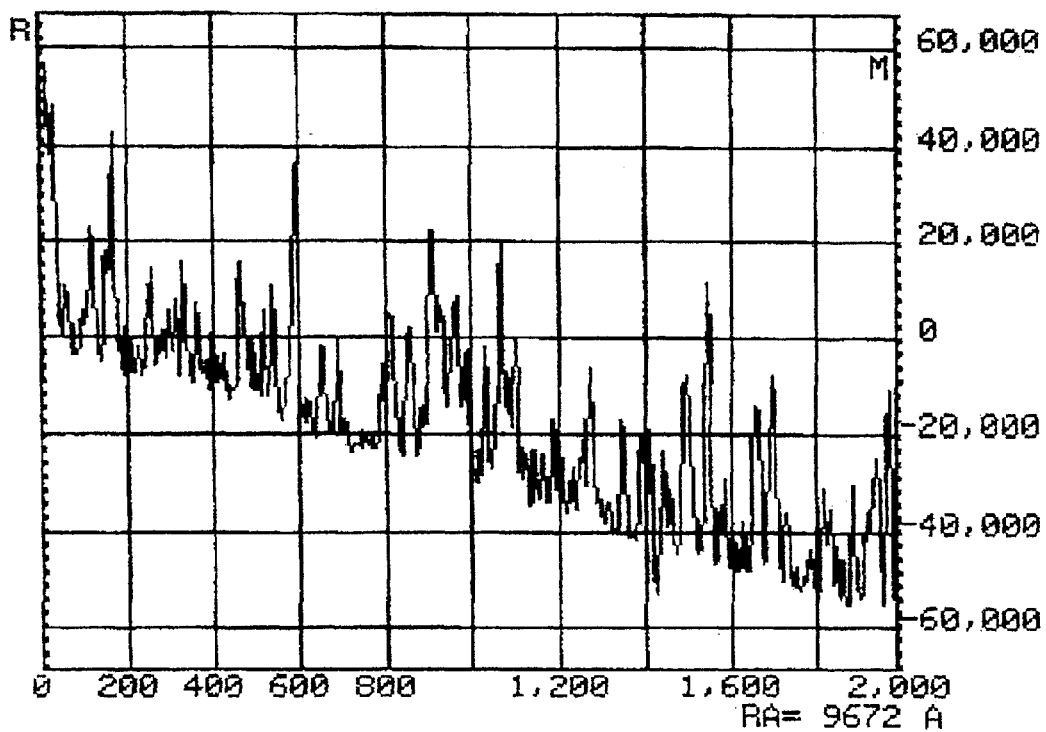

The micro-roughness of the surface of a deposited coating, as determined by precision profilometer, is shown on FIGS. 3a and 3b, respectively. The micro-roughness of a coating obtained by the filtered cathodic arc process in accordance with the present invention is shown on FIG. 3a, and that of a conventionally produced vapour deposit is shown on FIG. 3b.

The microhardness of the layered vapour deposited structure of the present invention is predominantly determined by the surface properties of the uppermost ceramic layer. Thus the micro-roughness of the magnetically filtered composite vapour deposited coatings, that is the average distance between the peaks and the valleys of the ceramic surface, is less than the total thickness of the uppermost ceramic layer.

The micro-hardness of the coating obtained by the filtered plasma arc vapour deposition process of the present invention is in excess of 20 GPa, but it is usually around 30 GPa.

It is noted that post-deposition heat treatment followed by quenching and tempering, included in the preferred embodiment, is a process step sequence regarded as conventional and no invention is claimed for the step sequence per se. It is not unusual that the substrate temperature during the coating deposition rises above the conversion temperature of the martensitic-austenitic phase transformation of the substrate, thereby lowering the strength and corrosion resistance of the steel substrate. Thus it may be necessary in obtaining hard-wearing, smooth coatings of low micro-roughness, to provide such heat treatment step sequence to re-establish the original strength and corrosion resistance of the substrate material.

In another embodiment the retention of the initial hardness of the substrate subsequent to the magnetically filtered cathodic arc plasma deposition may not be an essential feature, or the mechanical strength and toughness may not be affected adversely during the cathodic plasma arc deposition. Such applications can include hard surfaced kitchen utensils, cutting tools obtained by depositing a hard coating on a substrate of titanium carbide or titanium diboride, or similar applications where smooth, hard surfaces and sharp edges are essential but high strength combined with high corrosion resistance of the substrate is of lesser importance. In such embodiments post-deposition heat treatment may not be required.

As has been referred to hereinabove, in order to obtain a hard, smooth, and sharp edged coating, it is preferred to provide at least two pairs, and preferably more, of metal—ceramic layers deposited by means of magnetically filtered cathodic arc plasma, in accordance with the present invention. The process will provide hard, even-surfaced coatings by utilizing only a single target in the plasma guide chamber, however, for best results, a plasma guide chamber having two opposing targets of the same metal are used, or in some instances, a pair of different, but opposing metal targets may be used for obtaining alloy deposits. The two opposing targets generate two ion streams which are made to converge by magnetic fields and subsequently magnetically filtered, as shown in FIG. 1. However, other arrangements of magnetic filtering means which perform the same function, may also be utilized.

The following examples will illustrate the best mode of operation of the invention.

EXAMPLE 1

Commercially available, ASA 440A martensitic steel pieces machined into sickle shapes for use as dental scalers, were heat treated to hardness 54 HRC in a conventional vacuum heat treatment process, then sharpened and polished to Ra<0.08 $\mu$m. The martensitic steel pieces having sickle shapes at one end, were then ultrasonically cleaned in non-phosphate detergent and subsequently chemically cleaned in acetone and isopropyl alcohol, air-dried at 100° C., then mounted to serve as substrates in the vacuum chamber of a large area filtered plasma arc deposition unit, similar to that shown on FIG. 1. Two titanium targets were installed in each of the plasma guide chambers, thereby providing 4 cathodic arc sources. In all subsequent plasma arc process steps the arc current was maintained at 100 amperes and the auxiliary arc current at 50 amperes for immersing the substrates in a plasma environment. The steel substrates were heated to 350° C. by a radiant heater array, the temperature being measured by infrared pyrometer.

The substrates were then subjected to ion-cleaning in an argon atmosphere of $6 \cdot 10^{-4}$ Torr. The deflecting coils were not activated in the ion-cleaning stage, thus the arc source was used only as an electron emitter providing high ionisation, and an argon plasma of characteristic density of ion current saturation 1 to 10 mA/cm$^2$. The bias potential was set at –300V, and maintained for 5 min.

The ion-cleaning step was followed by the deposition of the first titanium layer on the sickle shaped end of the substrate. The argon pressure was reduced to $2 \cdot 10^{-4}$ Torr and the substrate bias potential to –40V. The deflecting coils were activated and the titanium plasma stream generated by the cathodic plasma arc source yielded a titanium deposit layer of 0.1 $\mu$m thickness in 5 minutes. Subsequently, the argon was replaced by nitrogen at the same $2 \cdot 10^{-4}$ Torr pressure, whilst other parameters were kept at the same level. A deposit of TiN of 0.4 $\mu$m layer thickness was obtained in 25 minutes.

The process of depositing alternating titanium and titanium nitride layers was repeated five times to obtain a total number of 12 layers, having a total thickness of 3 $\mu$m.

Following the deposition process the scalers were allowed to cool in a nitrogen atmosphere of $10^{-3}$ Torr. When the temperature dropped to 100° C., the scalers bearing 6 pairs of deposited Ti-TiN layers were removed from the vacuum chamber. Half of the scalers were subjected to conventional post-deposition vacuum heat treatment.

EXAMPLE 2

A similar number of ASA 400A dental scalers were treated in the same process step sequence as described in Example 1, however, the nitrogen in obtaining the titanium ceramic compound layer was replaced by a gas mixture consisting of 70% nitrogen, 25% methane, and 5% oxygen to yield a deposit of TiOCN. The substrate bias potential was set at –80V. The coated scalers had a total of 12 alternating titanium—titanium oxycarbonitride layers (6 pairs) amounting to 3 $\mu$m thickness. Half of the coated scalers received conventional post-deposition vacuum heat treatment as in Example 1.

EXAMPLE 3

The performance of scalers having coating layers obtained in accordance with the present invention was tested and compared to uncoated scalers and commercially available scalers having only TiN coating.

The wear resistance of the scalers was tested in a simulated clinical test in which the scalers were tested by scraping lamb bone. Lamb bone has hardness which is very close to that of human dentine. A gelatinous protein solution was applied as lubricant to act as a substitute for human saliva. In the tests the scalers scraped the lamb bone with a reciprocating motion applied at a force of contact of 150 g for stroke lengths of 2.5 cm. The angle of attack was adjusted to produce approximately the same amount of bone scraping at each scrape. The cutting edge and the tip of the scrapers were examined by viewing through a microscope at magnification 40× for signs of wear and/or coating failure.

The scalers were also tested for corrosion resistance by repeated exposure to conventional scrubbing, resistance to wear by ultrasonic cleaning in ultrasonic cleaning solutions, and steam-autoclaving at 15 to 20 psi. pressure of steam.

TABLE 2

| Item # | Sample Description | Number of strokes before rounding | Resistance to 100 sterilisation cycles | Clinical trials (number of patients treated before rounding) |
|---|---|---|---|---|
| 1 | Uncoated control sample scaler | 300 | Moderate discoloration | 5 |
| 2 | Ti/TiN 12 layers coating without post-deposition heat treatment | 3200 | Slight spots of discoloration | 70 |
| 3 | Ti/TiN 12 layers coating with post-deposition heat treatment | 9500 | Slight spots of discoloration in 40% scalers | 180 |

TABLE 2-continued

| Item # | Sample Description | Number of strokes before rounding | Resistance to 100 sterilisation cycles | Clinical trials (number of patients treated before rounding) |
|---|---|---|---|---|
| 4 | Ti/TiOCN 12 layers coating without post-deposition heat treatment | 4000 | No visible corrosion | 95 |
| 5 | Ti/TiOCN 12 layers coating with post-deposition heat treatment | 11000 | No visible corrosion | 220 |
| 6 | Conventional 3 mm TiN direct cathodic arc coating without post-deposition heat treatment | 600 | Severe pitting corrosion, and partial coating delamination | Not used |
| 7 | Conventional 3 mm TiN direct cathodic arc coating with post deposition heat treatment | Coating disintegrated |  | Not used |

The wear and corrosion resistance of scalers prepared in accordance with the present invention, compared with uncoated scalers and scalers having coating deposited by conventional cathodic plasma arc deposition techniques, are presented in Table 2.

Clinical trials were also conducted, and the Dumber of patients taking part in each set of trials is also indicated in Table 2. In the column heading of Table 2 the expression "rounding" is used to denote loss of sharpness of the cutting edge of the scaler tested.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of the present invention as defined by the following claims.

We claim:

1. A wear resistant, composite vapour deposited metal-ceramic coating on a substrate capable of electrical conduction, comprising:
   at least one metallic layer selected from the group consisting of titanium, chromium, vanadium, aluminum, molybdenum, niobium, tungsten, hafnium, zirconium, and alloys thereof, and having a metallic layer thickness;
   at least one ceramic layer selected from the group consisting of nitrides, carbides, carbonitrides, oxycarbides and oxynitrides;
   wherein said composite, vapour deposited metal-ceramic coating has a thickness greater than 1 $\mu$m, an average exposed surface micro-roughness less than 0.1 $\mu$m and a micro-hardness in excess of 20 GPa.

2. A wear resistant, composite vapour deposited metal-ceramic coating on a substrate as claimed in claim 1, wherein said substrate is made of steel.

3. A wear resistant, composite vapour deposited metal-ceramic coating on a substrate as claimed in claim 2, wherein said steel substrate has an ion nitride surface layer between said steel substrate and said composite vapour deposited metal-ceramic coating.

4. A wear resistant, composite vapour deposited metal-ceramic coating on a substrate as claimed in claim 1, wherein said composite vapour deposited coating comprises at least one pair of a metal layer and a ceramic layer having a common metal ion component.

5. A wear resistant, composite vapour deposited metal-ceramic coating on a substrate as claimed in claim 4, wherein said vapour deposited coating comprises a multiplicity of pairs of metal layer and ceramic layer having a common metal ion component.

6. A wear resistant, composite vapour deposited metal-ceramic coating on a substrate as claimed in claim 1, wherein said composite vapour deposited metal-ceramic coating is heat treated subsequent to deposition.

7. A wear resistant, composite vapour deposited metal-ceramic coating on a substrate as claimed in claim 1, wherein said coating thickness ranges between 0.25 and 20 $\mu$m.

8. A wear resistant, composite vapour deposited metal-ceramic coating on a substrate as claimed in claim 1, wherein said thickness of said metal layer ranges between 0.05 $\mu$m and 0.5 $\mu$m.

* * * * *

UNITED STATES PATENT AND TRADEMARK OFFICE
Certificate

Patent No. 6,617,057 B2                                                   Patented: September 9, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Vladimir Gorokhovsky, Toronto, Canada.

Signed and Sealed this Eighth Day of June 2004.

DEBORAH JONES
*Supervisory Patent Examiner*
Art Unit 1775

UNITED STATES PATENT AND TRADEMARK OFFICE
CERTIFICATE OF CORRECTION

PATENT NO. : 6,617,057 B2
DATED : September 9, 2003
INVENTOR(S) : Vladimir Gorokhovsky et al.

It is certified that error appears in the above-identified patent and that said Letters Patent is hereby corrected as shown below:

Column 11,
Line 26, the word "Dumber" should read -- number --.

Signed and Sealed this

Twenty-ninth Day of March, 2005

JON W. DUDAS
*Director of the United States Patent and Trademark Office*